(12) United States Patent
Lee

(10) Patent No.: US 8,854,551 B2
(45) Date of Patent: Oct. 7, 2014

(54) VIDEO SIGNAL PROCESSING APPARATUSES

(71) Applicant: Samsung Electronics Co., Ltd., Suwon-si (KR)

(72) Inventor: Ki-Ho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/025,977

(22) Filed: Sep. 13, 2013

(65) Prior Publication Data

US 2014/0085539 A1    Mar. 27, 2014

(30) Foreign Application Priority Data

Sep. 27, 2012  (KR) .................. 10-2012-0108090

(51) Int. Cl.
*H03M 1/12* (2006.01)
*H03M 1/00* (2006.01)
*H04N 5/12* (2006.01)

(52) U.S. Cl.
CPC .. *H04N 5/12* (2013.01); *H03M 1/00* (2013.01)
USPC .......................... 348/572; 341/155

(58) Field of Classification Search
CPC ..... H03M 1/12; H03M 1/1205; H03M 1/121; H03M 1/1215
USPC ............................ 348/537, 572, 573; 341/155
See application file for complete search history.

(56) References Cited

U.S. PATENT DOCUMENTS

| 4,768,015 | A |   | 8/1988 | Amano |
|---|---|---|---|---|
| 6,097,443 | A | * | 8/2000 | Volmari .................. 348/572 |
| 7,280,091 | B2 |   | 10/2007 | Wang et al. |
| 7,541,952 | B1 |   | 6/2009 | Sankaran et al. |
| 7,777,660 | B2 | * | 8/2010 | Chen et al. .................... 341/155 |
| 7,839,323 | B2 |   | 11/2010 | Kidambi |
| 7,893,852 | B2 |   | 2/2011 | Wegener |
| 7,916,050 | B1 |   | 3/2011 | Mujica et al. |
| 8,144,040 | B2 |   | 3/2012 | Messier et al. |
| 2005/0270212 | A1 |   | 12/2005 | Smith et al. |
| 2010/0309033 | A1 |   | 12/2010 | Nagarajan et al. |
| 2012/0044004 | A1 |   | 2/2012 | Payne et al. |

FOREIGN PATENT DOCUMENTS

| JP | 936741 | 2/1997 |
|---|---|---|
| JP | 1028053 | 1/1998 |
| JP | 2004214918 A | 7/2004 |

* cited by examiner

*Primary Examiner* — Michael Lee
(74) *Attorney, Agent, or Firm* — Harness, Dickey & Pierce, PLC

(57) ABSTRACT

A video signal processing apparatus may include a first analog-to-digital converter (ADC) configured to convert an analog video signal into a first digital video signal according to a first clock; and/or a second ADC configured to convert the analog video signal into a second digital video signal according to a second clock that is different from the first clock. The first and second clocks may have a first phase difference in a first section of the analog video signal, such that the first and second ADCs operate alternately, first ADC then second ADC, and the first and second clocks may be generated to have a second phase difference, that is different from the first phase difference, in a second section of the analog video signal that is different from the first section, such that the first and second ADCs operate alternately, second ADC then first ADC.

20 Claims, 12 Drawing Sheets

VIDEO SIGNAL PROCESSING APPARATUSES

CROSS-REFERENCE TO RELATED APPLICATION(S)

This application claims priority from Korean Patent Application No. 10-2012-0108090, filed on Sep. 27, 2012, in the Korean Intellectual Property Office (KIPO), the entire contents of which are incorporated herein by reference.

BACKGROUND

1. Field

Some example embodiments may relate to video signal processing apparatuses.

2. Description of Related Art

An analog-to-digital converter (ADC) of a video signal processing apparatus converts an analog video signal into a digital video signal. To process a high-resolution video signal, the video signal processing apparatus may use an interleaving ADC which employs a plurality of ADCs.

SUMMARY

Some example embodiments may provide video signal processing apparatuses that may compensate for offsets caused by the use of interleaving analog-digital converters (ADC) and can process signals at high speed.

In some example embodiments, a video signal processing apparatus may comprise a first analog-to-digital converter (ADC) configured to convert an analog video signal into a first digital video signal according to a first clock; and/or a second ADC configured to convert the analog video signal into a second digital video signal according to a second clock that is different from the first clock. The first clock and the second clock may be generated to have a first phase difference in a first section of the analog video signal, such that the first ADC and the second ADC operate alternately in an order of the first ADC and the second ADC, and the first clock and the second clock are generated to have a second phase difference, that is different from the first phase difference, in a second section of the analog video signal that is different from the first section of the analog video signal, such that the first ADC and the second ADC operate alternately in the order of the second ADC and the first ADC.

In some example embodiments, the apparatus may further comprise a clock generator configured to generate the first clock and the second clock, such that the first clock and the second clock have the first phase difference in the first section of the analog video signal, and such that the first clock and the second clock have the second phase difference, that is different from the first phase difference, in the second section of the analog video signal.

In some example embodiments, the clock generator may be configured to receive a horizontal synchronization signal and/or may be configured to determine the second section of the analog video signal based on the horizontal synchronization signal.

In some example embodiments, the clock generator may be configured to receive a vertical synchronization signal and/or may be configured to determine the second section of the analog video signal based on the vertical synchronization signal.

In some example embodiments, the apparatus may further comprise a clock generator configured to generate the first clock and the second clock in synchronization with a reference clock. A frequency of the first clock and/or a frequency of the second clock may be half a frequency of the reference clock.

In some example embodiments, the apparatus may further comprise a correction logic configured to synthesize the first digital video signal and the second digital video signal into a single digital video signal; and/or an adder configured to compensate for offset of the single digital video signal.

In some example embodiments, the correction logic may be configured to generate the single digital video signal that comprises the first digital video signal as an odd field and the second digital video signal as an even field.

In some example embodiments, the adder may be configured to receive a select signal which selects any one of the odd field and the even field and/or may be configured to compensate for offset of a digital video signal of the selected field.

In some example embodiments, the apparatus may further comprise a clamp circuit configured to adjust direct current (DC) level of the analog video signal. The clamp circuit may comprises a first current source connected to a first voltage; a second current source connected to a second voltage; a first switch connecting the first current source to a receiving terminal of the analog video signal; and/or a second switch connecting the second current source to the receiving terminal of the analog video signal.

In some example embodiments, the receiving terminal of the analog video signal may comprise an alternating current (AC) coupling capacitor.

In some example embodiments, a video signal processing apparatus may comprise a first analog-to-digital converter (ADC) configured to convert an analog video signal into a first digital video signal; a second ADC configured to convert the analog video signal into a second digital video signal; and/or a clock generator configured to generate a first clock that operates the first ADC and a second clock that operates the second ADC and is different from the first clock. The clock generator may be configured to change an order in which the first ADC and the second ADC operate alternately by changing a phase difference between the first clock and the second clock when a switch is made from one line or frame of the analog video signal to another.

In some example embodiments, the clock generator may be configured to receive a horizontal synchronization signal and/or may be configured to determine whether a switch is made from one line of the analog video signal to another based on the horizontal synchronization signal.

In some example embodiments, the clock generator may be configured to receive a vertical synchronization signal and/or may be configured to determine whether a switch is made from one frame of the analog video signal to another based on the vertical synchronization signal.

In some example embodiments, the apparatus may further comprise a correction logic configured to generate a single digital video signal that comprises the first digital video signal as an odd field and the second digital video signal as an even field; and/or an adder configured to receive a select signal that selects any one of the odd field and the even field and configured to compensate for offset of a digital video signal of the selected field.

In some example embodiments, the apparatus may further comprise a clamp circuit configured to adjust direct current (DC) level of the analog video signal. The clamp circuit may comprise a first current source connected to a first voltage; a second current source connected to a second voltage; a first switch connecting the first current source to a receiving terminal of the analog video signal; and/or a second switch connecting the second current source to the receiving terminal of the analog video signal.

In some example embodiments, a video signal processing apparatus may comprise first and second analog-to-digital converters (ADC) configured to operate in a time-interleaving manner according to first and second clocks, respectively. The first and second ADCs may be configured to convert an analog video signal into first and second digital video signals, respectively. The first clock and the second clock may be generated to have a first phase difference in a first section of the analog video signal and a second phase difference in a second section of the analog video signal. The first and second ADCs may operate alternately in a first order in the first section of the analog video signal and in a second order in the second section of the analog video signal.

In some example embodiments, the apparatus may further comprise a clock generator configured to generate the first and second clocks.

In some example embodiments, the apparatus may further comprise a correction logic configured to synthesize the first and second digital video signals into a single digital video signal.

In some example embodiments, the apparatus may further comprise an adder configured to compensate for offset of the single digital video signal.

In some example embodiments, the apparatus may further comprise a clamp circuit configured to adjust direct current (DC) level of the analog video signal.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION OF THE EMBODIMENTS

Figure 1:
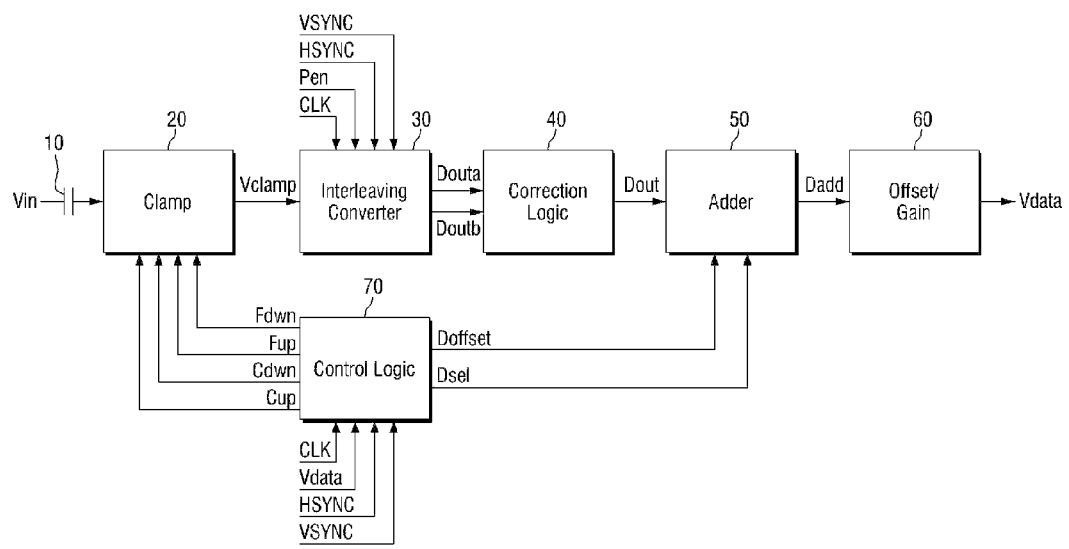
FIG. 1 is a schematic block diagram of a video signal processing apparatus according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

The configuration of a video signal processing apparatus according to some example embodiments will now be described with reference to FIGS. 1 through 3. FIG. 1 is a schematic block diagram of a video signal processing apparatus 1 according to some example embodiments.

Referring to FIG. 1, the video signal processing apparatus 1 according to some example embodiments includes a receiving terminal 10, a clamp circuit 20, an interleaving converter 30, a correction logic 40, an adder 50, an offset/gain circuit 60, and a control logic 70.

The receiving terminal 10 receives an analog video signal Vin. The analog video signal Vin is received in the form of a voltage at a certain level. The receiving terminal 10 may be an alternating current (AC) coupling capacitor. The receiving terminal 10 may eliminate a direct current (DC) component of the analog video signal Vin and allow only an AC component of the analog video signal Vin to pass therethrough.

The clamp circuit 20 receives the analog video signal Vin from the receiving terminal 10. The clamp circuit 20 adjusts a DC level of the analog video signal Vin according to a control signal. Control signals such as Cup, Cdwn, Fup and Fdwn signals are input to the clamp circuit 20. The detailed configuration and operation of the clamp circuit 20 will be described in greater detail later with reference to FIG. 2.

The interleaving converter 30 receives the analog video signal Vclamp with the adjusted DC level from the clamp circuit 20. The interleaving converter 30 includes a plurality of analog-digital converters (ADCs) 31 and 32 and may operate in a time-interleaving manner. The ADCs 31 and 32 respectively convert the analog video signal Vclamp into digital video signals Douta and Doutb according to a control signal. Control signals such as a clock CLK, an enable signal Pen, a horizontal synchronization signal HSYNC, and a vertical synchronization signal VSYNC are input to the interleaving converter 30. The detailed configuration and operation of the interleaving converter 30 will be described in greater detail later with reference to FIG. 3.

The correction logic 40 receives the digital video signals Douta and Doutb from the interleaving converter 30. The correction logic 40 synthesizes the first and second digital video signals Douta and Doutb received from the interleaving converter 30 into a single digital video signal Dout. For example, when receiving the first digital video signal Douta of 5 bits and the second digital video signal Doutb of 5 bits, the correction logic 40 synthesizes the first digital video signal Douta and the second digital video signal Doutb into a 10-bit digital signal. The 10-bit digital signal includes a 5-bit odd field and a 5-bit even field. The 5 bits of the first digital video signal Douta are sequentially placed in the odd field, and the 5 bits of the second digital video signal Doutb are sequentially placed in the even field.

The adder 50 receives the digital video signal Dout from the correction logic 40. The adder 50 compensates for an offset of the digital video signal Dout according to a control signal. Here, the offset is a difference between the first digital video signal Douta and the second digital video signal Doutb. Control signals such as an offset signal Doffset and a select signal Dsel are input to the adder 50. The detailed operation of the adder 50 will be described in greater detail later with reference to FIGS. 14 and 15.

The offset/gain circuit 60 receives the digital video signal Dadd having the offset compensated for from the adder 50. The offset/gain circuit 60 corrects the brightness between red, green, blue (RGB) paths and color of the digital video signal Dadd and outputs digital video data Vdata.

The control logic 70 outputs control signals to control the clamp circuit 20 and the adder 50. The control logic 70 outputs control signals such as the Cup, Cdwn, Fup and Fdwn signals to the clamp circuit 20 and outputs control signals such as the offset signal Doffset and the select signal Dsel to the adder 50. The clock CLK, the digital video data Vdata, the horizontal synchronization signal HSYNC, the vertical synchronization signal VSYNC, etc. are input to the control logic 70, and the control logic 70 outputs control signals based on the input signals.

Figure 2:
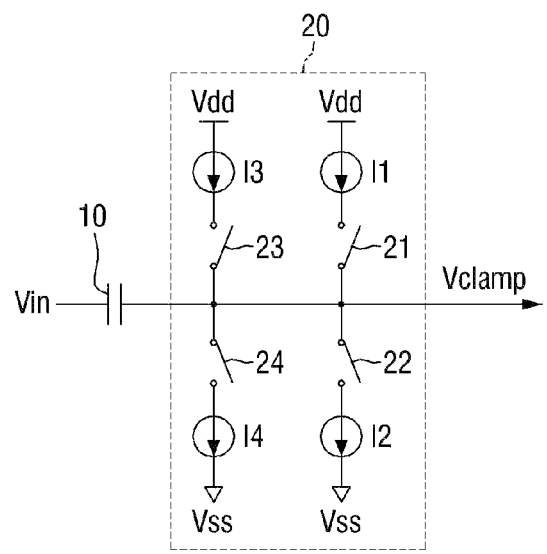
FIG. 2 is a schematic circuit diagram of a receiving terminal and a clamp circuit shown in FIG. 1.

FIG. 2 is a schematic circuit diagram of the receiving terminal 10 and the clamp circuit 20 shown in FIG. 1.

The clamp circuit 20 includes a first clamp unit and a second clamp unit.

The first clamp unit includes a first current source I1, a second current source I2, a first switch 21, and a second switch 22. A side of the first current source I1 is connected to a power supply voltage Vdd, and the other side of the first current source I1 is connected to the first switch 21. The first switch 21 connects the first current source I1 to the receiving terminal 10 in response to a control signal. A side of the second current source I2 is connected to the second switch 22, and the other side of the second current source I2 is connected to a ground voltage Vss. The second switch 22 connects the second current source I2 to the receiving terminal 10 in response to a control signal.

The first switch 21 is turned on by the Cup signal. When the first switch 21 is turned on, an electric current corresponding to the first current source I1 is supplied. The second switch 22 is turned on by the Cdwn signal. When the second switch 22 is turned on, an electric current corresponding to the second current source I2 flows to the ground voltage Vss. The first clamp unit adjusts the DC level of the analog video signal Vin while turning on the first switch 21 and the second switch 22 in response to the Cup signal and the Cdwn signal.

The second clamp unit includes a third current source I3, a fourth current source I4, a third switch 23, and a fourth switch 24. A side of the third current source I3 is connected to a power supply voltage Vdd, and the other side of the third current source I3 is connected to the third switch 23. The third switch 23 connects the third current source I3 to the receiving terminal 10 in response to a control signal. A side of the fourth current source I4 is connected to the fourth switch 24, and the other side of the fourth current source I4 is connected to a ground voltage Vss. The fourth switch 24 connects the fourth current source I4 to the receiving terminal 10 in response to a control signal.

The third switch 23 is turned on by the Fup signal. When the third switch 23 is turned on, an electric current corresponding to the third current source I3 is supplied. The fourth switch 24 is turned on by the Fdwn signal. When the fourth switch 24 is turned on, an electric current corresponding to the fourth current source I4 flows to the ground voltage Vss. The second clamp unit adjusts the DC level of the analog video signal Vin while turning on the third switch 23 and the fourth switch 24 in response to the Fup signal and the Fdwn signal FIG. 3 is a schematic circuit diagram of the interleaving converter 30 shown in FIG. 1.

Figure 3:
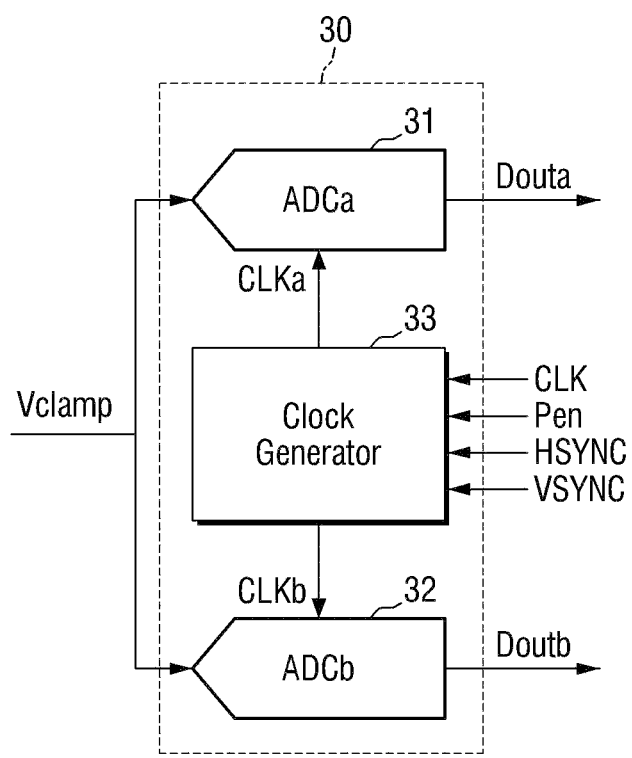
FIG. 3 is a schematic circuit diagram of an interleaving converter shown in FIG. 1.

Referring to FIG. 3, the interleaving converter 30 includes the first ADC 31 and the second ADC connected in parallel to each other. The first ADC 31 converts the analog video signal Vclamp into the first digital video signal Douta according to a first input clock CLKa, and the second ADC 32 converts the analog video signal Vclamp into the second digital video signal Doutb according to a second input clock CLKb. The first ADC 31 and the second ADC 32 may be time-interleaved.

A clock generator 33 generates the input clocks CLKa and CLKb for operating the ADCs 31 and 32. The clock generator 33 generates the first input clock CLKa and the second input clock CLKb based on control signals such as the clock CLK, the enable signal Pen, the horizontal synchronization signal HSYNC and the vertical synchronization signal VSYNC. The horizontal synchronization signal HSYNC is a signal synchronized with a time at which a switch is made from a first line of a video image to a second line. The vertical synchronization signal VSYNC is a signal synchronized with a time at which a switch is made from a first frame of the video image to a second frame.

The clock generator 33 generates the first input clock CLKa and the second input clock CLKb in synchronization with the clock CLK. A frequency of the first input clock CLKa and a frequency of the second input clock CLKb may be half a frequency of the clock CLK. For example, the frequency of the clock CLK may be 160 MHz, and the frequency of the first input clock CLKa and the frequency of the second input clock CLKb may be 80 MHz.

Figure 4:
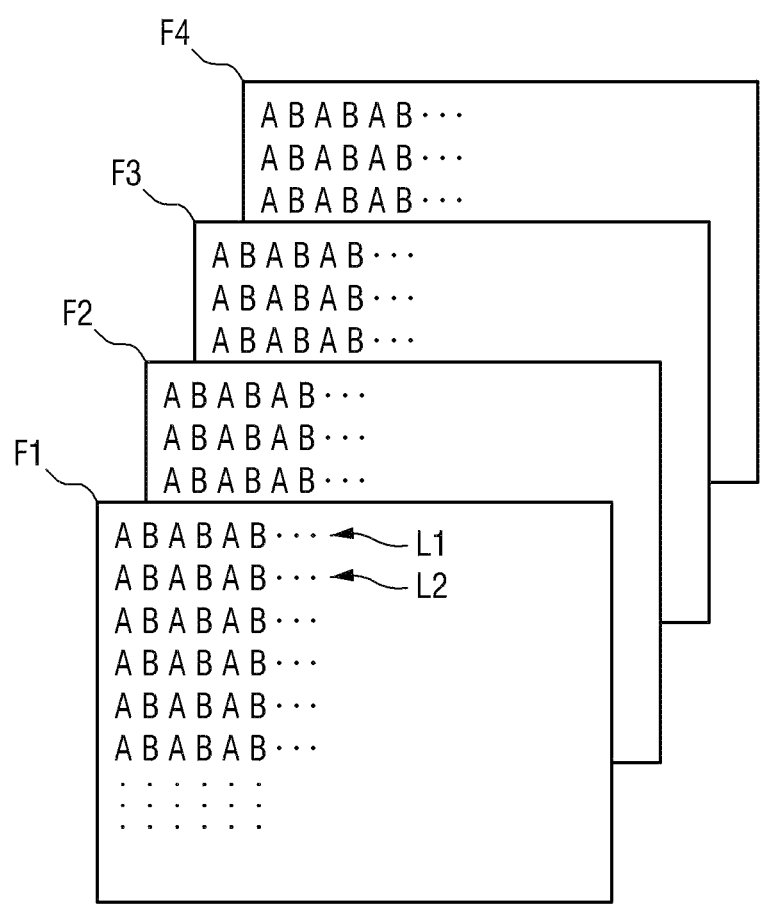
FIG. 4 is a schematic diagram illustrating a video image output from the video signal processing apparatus of FIG. 1.

FIG. 4 is a schematic diagram illustrating a video image output from the video signal processing apparatus 1 of FIG. 1.

Referring to FIG. 4, a video image output from the video signal processing apparatus 1 may include a plurality of frames. In some example embodiments, a case where the video image includes first through fourth frames F1 through F4 will be described as an example. Each of the first through fourth frames F1 through F4 may include a plurality of lines.

The video signal processing apparatus 1 may use a time-interleaving ADC. Accordingly, in each line of the video image output from the video signal processing apparatus 1, the first digital video signal Douta output from the first ADC 31 and the second digital video signal Doutb output from the second ADC 32 may be repeated alternately in an order in which the first ADC 31 and the second ADC 32 operate.

In FIG. 4, "A" represents digital video data corresponding to the first digital video signal Douta, and "B" represents digital video data corresponding to the second digital video signal Doutb. Referring to FIG. 4, the digital video data may be repeated in the order of "ABABAB" in a first line L1 of each frame and may also be repeated in the order of "ABABAB" in a second line L2 of each frame. Here, since the first digital video signal Douta and the second digital video signal Doutb are output from different ADCs, there may be an offset between the two signals.

To compensate for this offset, a phase difference between the first input clock CLKa which operates the first ADC 31 and the second input clock CLKb which operates the second ADC 32 is changed in some example embodiments. Accordingly, the order in which the first ADC 31 and the second ADC 32 operate alternately is changed.

More specifically, in a first section of the analog video signal Vin, the clock generator 33 according to some example embodiments generates the first input clock CLKa and the second input clock CLKb such that a first phase difference exists between the first input clock CLKa and the second input clock CLKb. Accordingly, the first ADC 31 and the second ADC 32 of the interleaving converter 30 operate alternately in the order of the first ADC 31 and the second ADC 32. In a second section of the analog video signal Vin, the clock generator 33 generates the first input clock CLKa and the second input clock CLKb such that a second phase difference exists between the first input clock CLKa and the second input clock CLKb. Accordingly, the first ADC 31 and the second ADC 32 of the interleaving converter 30 operate alternately in the order of the second ADC 32 and the first ADC 31.

The ways the operation order of the interleaving converter 30 is changed according to some example embodiments will now be described with reference to FIGS. 5 through 12.

Figure 5:
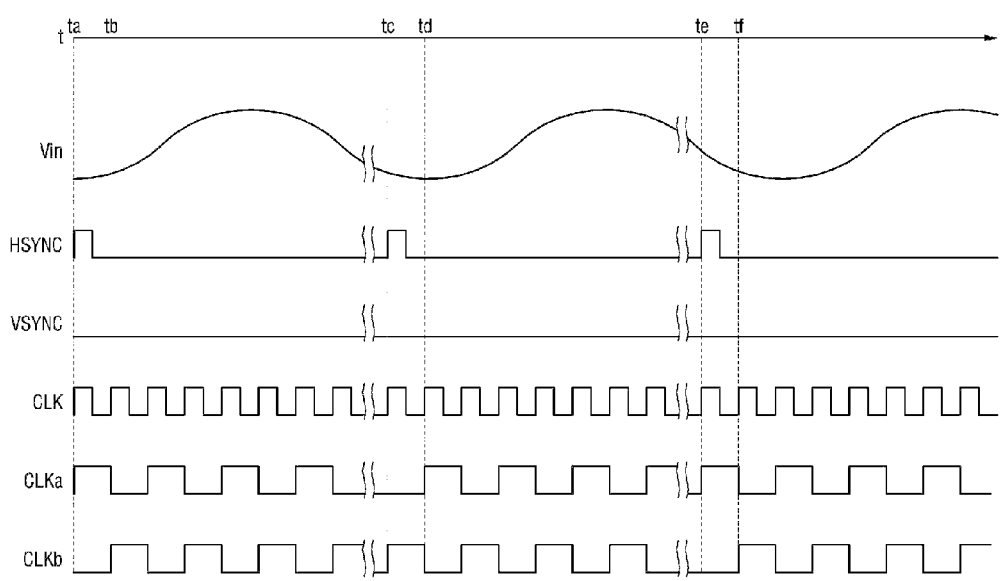
FIG. 5 is a schematic diagram illustrating the operation of an interleaving converter according to some example embodiments.
Figure 6:
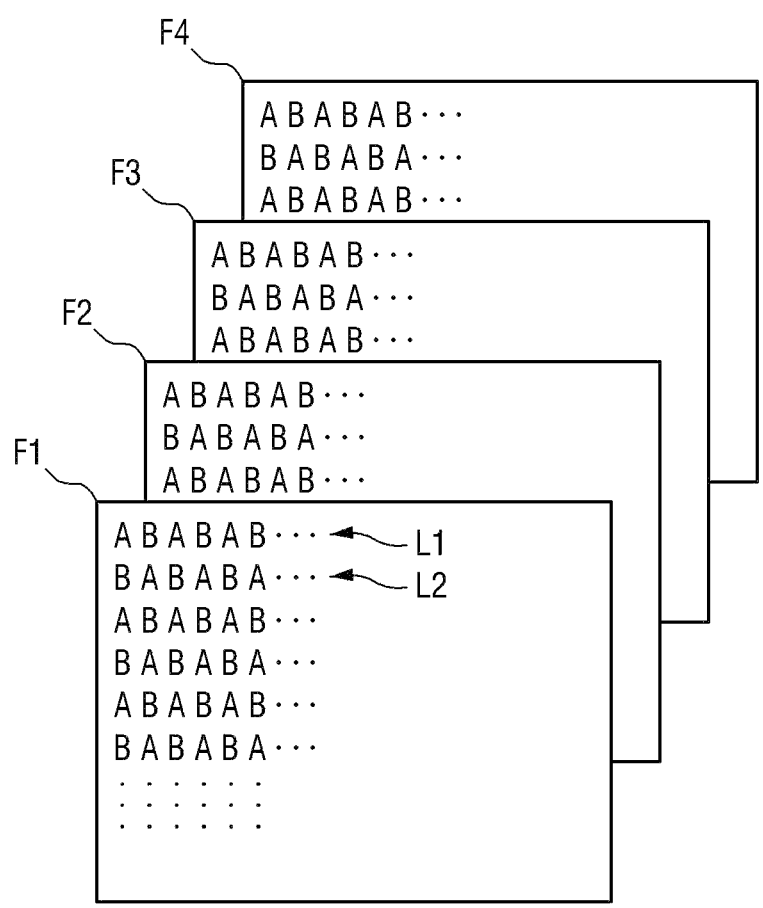
FIG. 6 is a schematic diagram illustrating a video image output after being converted according to some example embodiments.

FIG. 5 is a schematic diagram illustrating the operation of an interleaving converter 30 according to some example embodiments. FIG. 6 is a schematic diagram illustrating a video image output after being converted according to some example embodiments.

Referring to FIG. 5, the analog video signal Vin is input to the video signal processing apparatus 1. Then, the interleaving converter 30 according to some example embodiments samples the analog video signal Vin according to the first input clock CLKa and the second input clock CLKb and converts the analog video signal Vin. A plurality of ADCs 31 and 32 may sample the analog video signal Vin at rising edges of the first and second input clocks CLKa and CLKb.

In some example embodiments, a clock generator 33 may determine the first and second sections of the analog video signal Vin based on the horizontal synchronization signal HSYNC. In addition, the clock generator 33 may invert a phase of the first input clock CLKa and a phase of the second input clock CLKb based on the horizontal synchronization signal HSYNC.

At a time ta when the horizontal synchronization signal HSYNC is received for the first time, the first input clock CLKa and the second input clock CLKb are generated to have a phase difference of +180 degrees. For example, at the time ta, the first ADC 31 samples the analog video signal Vin at the rising edge of the first input clock CLKa. At a time tb, the second ADC 32 samples the analog video signal Vin at the rising edge of the second input clock CLKb.

At a time tc when the horizontal synchronization signal HSYNC is received for the second time, the first input clock CLKa and the second input clock CLKb are generated to have a phase difference of −180 degrees. For example, at the time tc, the second ADC 32 samples the analog video signal Vin at the rising edge of the second input clock CLKb. At a time td, the first ADC 31 samples the analog video signal Vin at the rising edge of the first input clock CLKa.

At a time te when the horizontal synchronization signal HSYNC is received for the third time, the first input clock CLKa and the second input clock CLKb are generated to have a phase difference of +180 degrees again. For example, at the time te, the first ADC 31 samples the analog video signal Vin at the rising edge of the first input clock CLKa. At a time tf, the second ADC 32 samples the analog video signal Vin at the rising edge of the second input clock CLKb.

Referring to FIG. 6, in a video image output after being converted according to some example embodiments, digital video data may be repeated in the order of "ABABAB" in a first line L1 of each frame F1, F2, F3 or F4 and in the order of "BABABA" in a second line L2 of each frame F1, F2, F3 or F4. The order of the digital video data in the first line L1 and the order of the digital video data in the second line L2 may alternate in the other lines of each frame F1, F2, F3 or F4. As described above, "A" represents digital video data corresponding to the first digital video signal Douta, and "B" represents digital video data corresponding to the second digital video signal Doutb.

In some example embodiments, the clock generator 33 determines whether a switch is made from one line of the analog video signal Vin to another based on the horizontal synchronization signal HSYNC and inverts the phase of the first input clock CLKa and the phase of the second input clock CLKb based on the horizontal synchronization signal HSYNC. Accordingly, whenever a switch is made from one line of the analog video signal Vin to another, the order in which the first ADC 31 and the second ADC 32 operate alternately may be changed, and the order in which the first digital video signal Douta and the second digital video signal Doutb are repeated alternately in each line of the video image may be changed.

Figure 7:
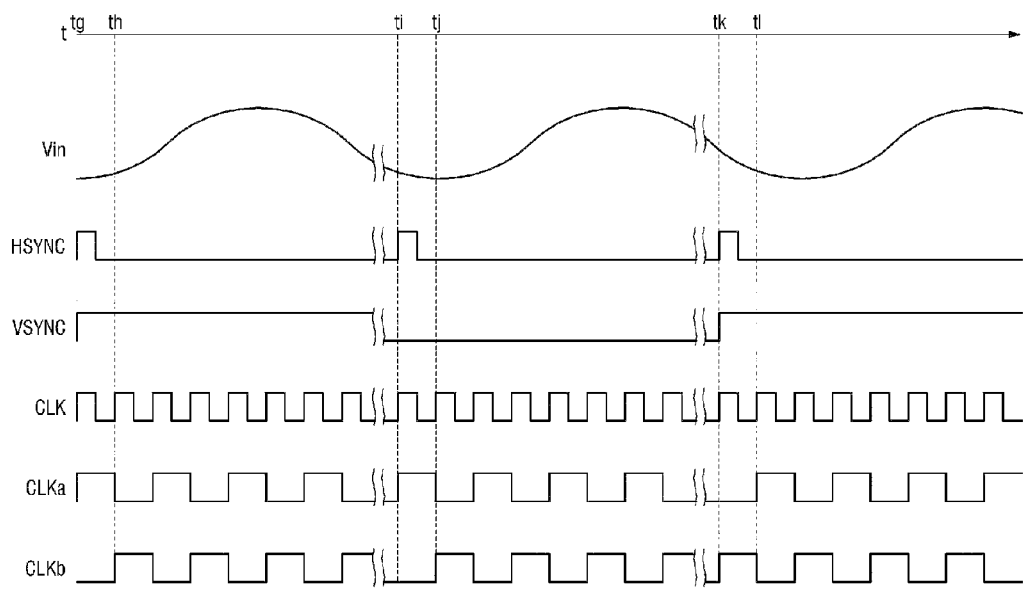
FIG. 7 is a schematic diagram illustrating the operation of an interleaving converter according to some example embodiments.
Figure 8:
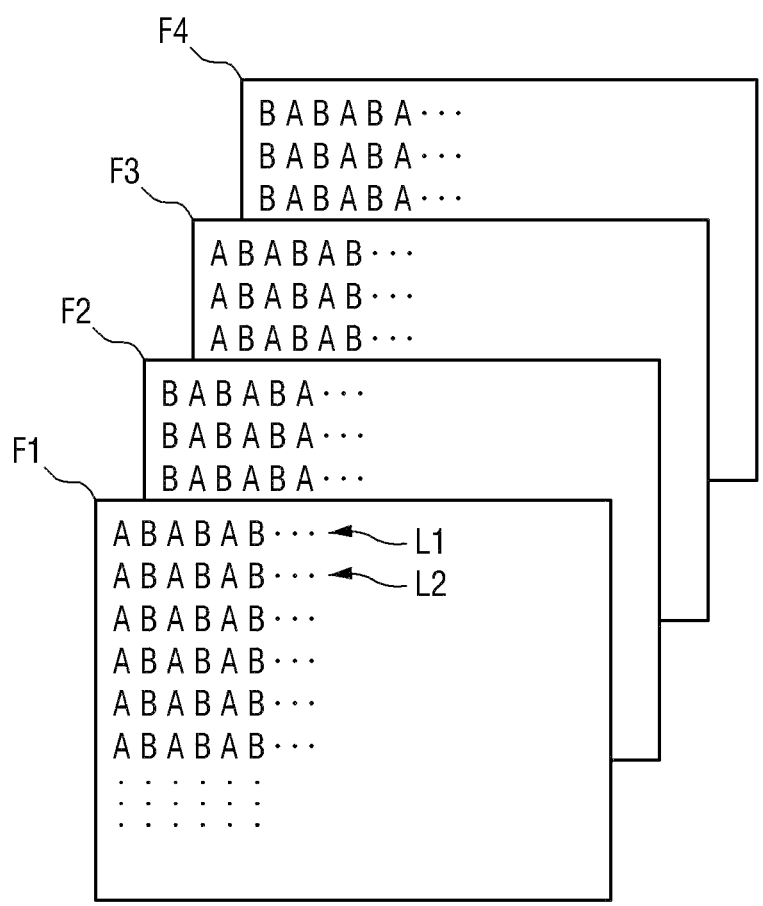
FIG. 8 is a schematic diagram illustrating a video image output after being converted according to some example embodiments.

FIG. 7 is a schematic diagram illustrating the operation of an interleaving converter according to some example embodiments. FIG. 8 is a schematic diagram illustrating a video image output after being converted according to some example embodiments. For simplicity, the following description will focus on differences from FIGS. 5 and 6.

In some example embodiments, a clock generator 33 may determine the first and second sections of the analog video signal Vin based on the vertical synchronization signal VSYNC. In addition, the clock generator 33 may invert the phase of the first input clock CLKa and the phase of the second input clock CLKb based on the vertical synchronization signal VSYNC.

At a time tg when the vertical synchronization signal VSYNC is received for the first time, the first input clock CLKa and the second input clock CLKb are generated to have a phase difference of +180 degrees. For example, at the time tg, a first ADC 31 samples the analog video signal Vin at the rising edge of the first input clock CLKa. At a time th, a second ADC 32 samples the analog video signal Vin at the rising edge of the second input clock CLKb.

Even if the horizontal synchronization signal HSYNC is received later, the first input clock CLKa and the second input clock CLKb are generated to have the same phase difference as the phase difference for the vertical synchronization signal VSYNC. For example, at a time ti, the first ADC 31 samples the analog video signal Vin at the rising edge of the first input clock CLKa. At a time tj, the second ADC 32 samples the analog video signal Vin at the rising edge of the second input clock CLKb.

At a time tk when the vertical synchronization signal VSYNC is received for the second time, the first input clock CLKa and the second input clock CLKb are generated to have a phase difference of −180 degrees. For example, at the time tk, the second ADC 32 samples the analog video signal Vin at the rising edge of the second input clock CLKb. At a time tl, the first ADC 31 samples the analog video signal Vin at the rising edge of the first input clock CLKa.

Referring to FIG. 8, in a video image output after being converted according to some example embodiments, digital video data may be repeated in the order of "ABABAB" in each line of a first frame F1 and in the order of "BABABA" in each line of a second frame F2. The order of the digital video data in each line of the first frame F1 and the order of the digital video data in each line of the second frame F2 may alternate in each line of the other frames F3 and F4. As described above, "A" represents digital video data corresponding to the first digital video signal Douta, and "B" represents digital video data corresponding to the second digital video signal Doutb.

In some example embodiments, the clock generator 33 determines whether a switch is made from one frame of the analog video signal Vin to another based on the vertical synchronization signal VSYNC and inverts the phase of the first input clock CLKa and the phase of the second input clock CLKb based on the vertical synchronization signal VSYNC. Accordingly, whenever a switch is made from one frame of the analog video signal Vin to another, the order in which the first ADC 31 and the second ADC 32 operate alternately may be changed, and the order in which the first digital video signal Douta and the second digital video signal Doutb are repeated alternately in each frame of the video image may be changed.

Figure 9:
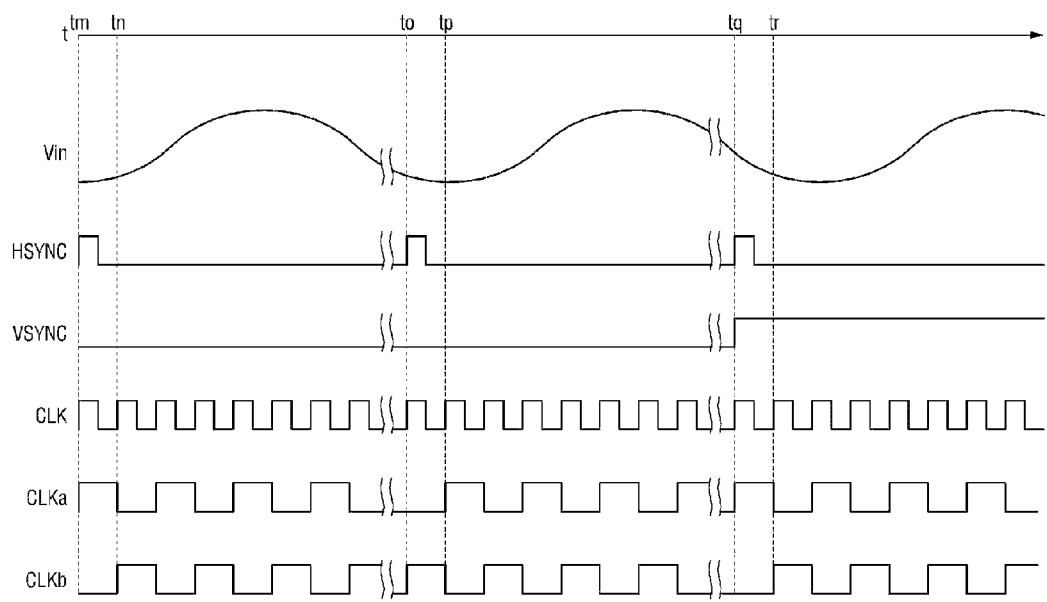
FIG. 9 is a schematic diagram illustrating the operation of an interleaving converter according to some example embodiments.
Figure 10:
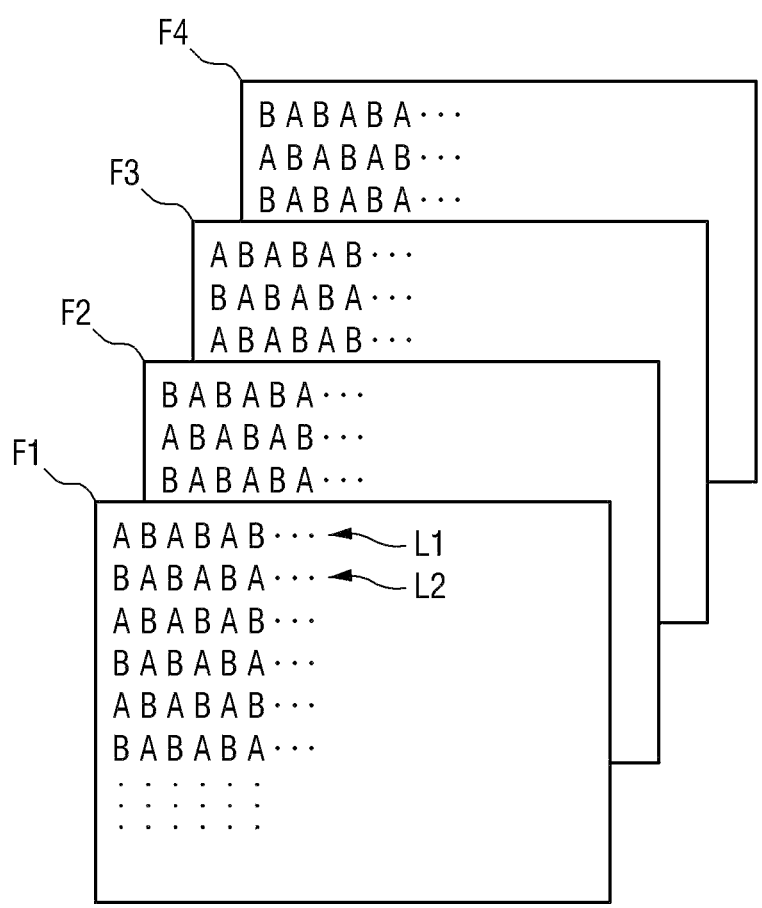
FIG. 10 is a schematic diagram illustrating a video image output after being converted according to some example embodiments.

FIG. 9 is a schematic diagram illustrating the operation of an interleaving converter according to some example embodiments. FIG. 10 is a schematic diagram illustrating a video image output after being converted according to some example embodiments. For simplicity, the following description will focus on differences from FIGS. 5 and 6.

In some example embodiments, a clock generator 33 may determine the first and second sections of the analog video signal Vin based on the horizontal synchronization signal HSYNC or the vertical synchronization signal VSYNC. In addition, the clock generator 33 may invert the phase of the first input clock CLKa and the phase of the second input clock CLKb based on the horizontal synchronization signal HSYNC or the vertical synchronization signal VSYNC.

At a time tm when the horizontal synchronization signal HSYNC is received for the first time, the first input clock CLKa and the second input clock CLKb are generated to have a phase difference of +180 degrees. For example, at the time tm, a first ADC 31 samples the analog video signal Vin at the rising edge of the first input clock CLKa. At a time tn, a second ADC 32 samples the analog video signal Vin at the rising edge of the second input clock CLKb.

At a time to when the horizontal synchronization signal HSYNC is received for the second time, the first input clock CLKa and the second input clock CLKb are generated to have a phase difference of −180 degrees. For example, at the time to, the second ADC 32 samples the analog video signal Vin at the rising edge of the second input clock CLKb. At a time tp, the first ADC 31 samples the analog video signal Vin at the rising edge of the first input clock CLKa.

At a time tq when the horizontal synchronization signal HSYNC and the vertical synchronization signal VSYNC are received together, the first input clock CLKa and the second input clock CLKb are generated to have a phase difference of +180 degrees again. For example, at the time tq, the first ADC 31 samples the analog video signal Vin at the rising edge of the first input clock CLKa. At a time tr, the second ADC 32 samples the analog video signal Vin at the rising edge of the second input clock CLKb.

Referring to FIG. 10, in a video image output after being converted according to some example embodiments, digital video data may be repeated in the order of "ABABAB" in a first line L1 of a first frame F1 and in the order of "BABABA" in a second line L2 of the first frame F1. In addition, the digital video data may be repeated in the order of "BABABA" in a first line L1 of a second frame F2 and in the order of "ABABAB" in a second line L2 of the second frame F2. The order of the digital video data in the first and second lines L1 and L2 of the first frame F1 and the order of the digital video data in the first and second lines L1 and L2 of the second frame F2 may alternate in first and second lines L1 and L2 of the other frames F3 and F4. As described above, "A" represents digital video data corresponding to the first digital video signal Douta, and "B" represents digital video data corresponding to the second digital video signal Doutb.

In some example embodiments, the clock generator 33 determines whether a switch is made from one line or frame of the analog video signal Vin to another based on the horizontal synchronization signal HSYNC or the vertical synchronization signal VSYNC and inverts the phase of the first input clock CLKa and the phase of the second input clock CLKb based on the horizontal synchronization signal HSYNC or the vertical synchronization signal VSYNC. Accordingly, whenever a switch is made from one line or frame of the analog video signal Vin to another, the order in which the first ADC 31 and the second ADC 32 operate alternately may be changed, and the order in which the first digital video signal Douta and the second digital video signal Doutb are repeated alternately in each line and each frame of the video image may be changed.

Figure 11:
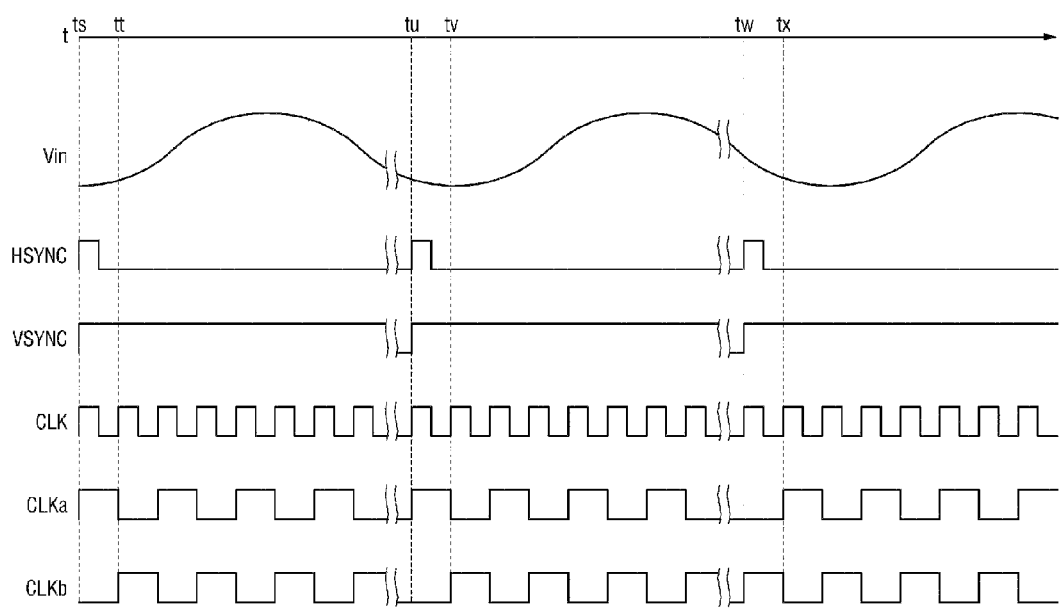
FIG. 11 is a schematic diagram illustrating the operation of an interleaving converter according to some example embodiments.
Figure 12:
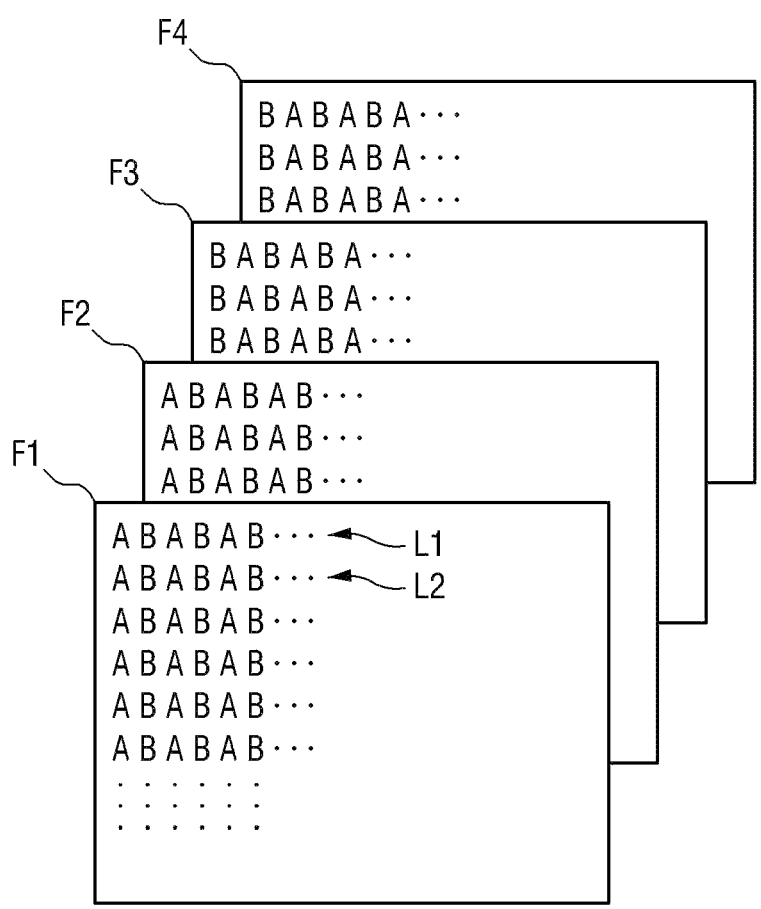
FIG. 12 is a schematic diagram illustrating a video image output after being converted according to some example embodiments.

FIG. 11 is a schematic diagram illustrating the operation of an interleaving converter according to some example embodiments. FIG. 12 is a schematic diagram illustrating a video image output after being converted according to some example embodiments. For simplicity, the following description will focus on differences from FIGS. 5 and 6.

In some example embodiments, a clock generator 33 may determine the first and second sections of the analog video signal Vin based on a desired rate (that may or may not be predetermined). For example, the clock generator 33 may invert the phase of the first input clock CLKa and the phase of the second input clock CLKb whenever the horizontal synchronization signal HSYNC or the vertical synchronization signal VSYNC is received multiple times.

At a time ts when the vertical synchronization signal VSYNC is received for the first time, the first input clock CLKa and the second input clock CLKb are generated to have a phase difference of +180 degrees. For example, at the time ts, a first ADC 31 samples the analog video signal Vin at the rising edge of the first input clock CLKa. At a time tt, a second ADC 32 samples the analog video signal Vin at the rising edge of the second input clock CLKb.

At a time tu when the vertical synchronization signal VSYNC is received for the second time, the first input clock CLKa and the second input clock CLKb are generated to have the same phase difference as the phase difference for the vertical synchronization signal VSYNC received for the first time. For example, at the time tu, the first ADC 31 samples the analog video signal Vin at the rising edge of the first input clock CLKa. At a time tv, the second ADC 32 samples the analog video signal Vin at the rising edge of the second input clock CLKb.

At a time tw when the vertical synchronization signal VSYNC is received for the third time, the first input clock CLKa and the second input clock CLKb are generated to have a phase difference of −180 degrees. For example, at the time tw, the second ADC 32 samples the analog video signal Vin at the rising edge of the second input clock CLKb. At a time tx, the first ADC 31 samples the analog video signal Vin at the rising edge of the first input clock CLKa.

Referring to FIG. 12, in a video image output after being converted according to some example embodiments, digital video data may be repeated in the order of "ABABAB" in each line of a first frame F1 and a second frame F2 and in the order of "BABABA" in each line of a third frame F3 and a fourth frame F4. The order of the digital video data in each line of the first and second frames F1 and F2 and the order of the digital video data in each line of the third and fourth frames F3 and F4 may alternate in each line of subsequent frames. As described above, "A" represents digital video data corresponding to the first digital video signal Douta, and "B" represents digital video data corresponding to the second digital video signal Doutb.

In some example embodiments, the clock generator 33 determines whether a switch is made from one line or frame of the analog video signal Vin to another based on the horizontal synchronization signal HSYNC or the vertical synchronization signal VSYNC and inverts the phase of the first input clock CLKa and the phase of the second input clock CLKb whenever multiple switches are made between the lines or frames of the analog video signal Vin. Accordingly, whenever a desired number (that may or may not be predetermined) of switches are made between the lines or frames of the analog video signal Vin, the order in which the first ADC 31 and the second ADC 32 operate alternately may be changed, and the order in which the first digital video signal Douta and the second digital video signal Doutb are repeated alternately in each line and each frame of the video image may be changed.

In some cases, the clock generator 33 may not invert the phases of the input clocks CLKa and CLkb. For example, the clock generator 33 may invert the phases of the input clocks CLKa and CLKb only when the input enable signal Pen is at a high level and may not invert the phases of the input clocks CLKa and CLKb when the enable signal Pen is at a low level.

In some example embodiments, digital video data output after being converted by a plurality of ADCs 31 and 32 is shuffled on a line or frame-by-line or frame basis. Since the shuffled digital video data is averaged on a line or frame-by-line or frame basis, an offset between the first digital video signal Douta and the second digital video signal Doutb can be compensated for. When the digital video data is shuffled, it means that the order in which the first digital video signal Douta of the first ADC 31 and the second digital video signal Doutb of the second ADC 32 are output alternately is changed whenever a new line or a new frame begins.

Figure 13:
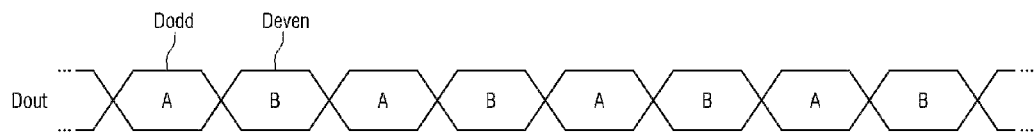
FIG. 13 is a schematic diagram illustrating a digital video signal output from a correction logic shown in FIG. 1.

FIG. 13 is a schematic diagram illustrating the digital video signal Dout output from the correction logic 40 shown in FIG. 1.

Referring to FIG. 13, the digital video signal Dout output from the correction logic 40 is a repetition of an odd field Dodd and an even field Deven sequentially. All bits of the first digital video signal Douta are sequentially placed in the odd field Dodd, and all bits of the second digital video signal Doutb are sequentially placed in the even field Deven. As described above, "A" represents digital video data corresponding to the first digital video signal Douta, and "B" represents digital video data corresponding to the second digital video signal Doutb.

When an offset exists between the first digital video signal Douta and the second digital video signal Doutb, it should be compensated for based on a smaller one of the two signals. In some example embodiments, to compensate for the offset between the first digital video signal Douta and the second digital video signal Doutb, the adder 50 selects the odd field Dodd or the even field Deven of the single digital video signal Dout according to the select signal Dsel and adds the offset signal Doffset to a digital signal of the selected field.

Figure 14:
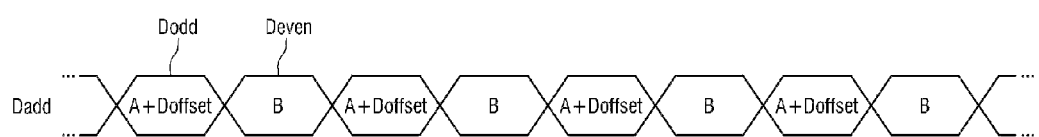
FIGS. 14 and 15 are schematic diagrams illustrating a digital video signal having an offset compensated for by an adder shown in FIG. 1.
Figure 15:
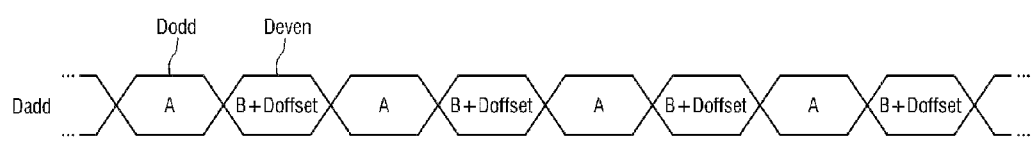

FIGS. 14 and 15 are schematic diagrams illustrating the digital video signal Dadd having an offset compensated for by the adder 50 shown in FIG. 1.

Referring to FIGS. 14 and 15, when the first digital video signal Douta is smaller than the second digital video signal Doutb, the adder 50 adds the offset signal Doffset to the first digital video signal Douta and outputs the signal Dadd without an offset. When the second digital video signal Doutb is smaller than the first digital video signal Douta, the adder 50 adds the offset signal Doffset to the second digital video signal Doutb and outputs the signal Dadd without the offset.

The adder 50 adds the offset signal Doffset not to all digital signals. Instead, the adder 50 adds the offset signal Doffset only to a smaller digital signal according to the select signal Dsel. To this end, the control logic 70 outputs the select signal Dsel based on the order in which an ADC outputting a smaller digital signal operates, from among the ADCs 31 and 32.

The adder 50 selects the odd field Dodd or the even field Deven of the single digital signal Dout according to the select signal Dsel. If the order in which the ADCs 31 and 32 operate is changed based on the horizontal synchronization signal HSYNC or the vertical synchronization signal VSYNC as described above, the control logic 70 may change the select signal Dsel based on the horizontal synchronization signal HSYNC or the vertical synchronization signal VSYNC. For example, the control logic 70 may output the select signal Dsel such that the odd field Dodd of the single digital signal Dout is selected in the first section of the analog video signal Vin and that the even field Deven of the single digital signal Dout is selected in the second section of the analog video signal Vin.

In some example embodiments, offsets of not all digital signals output from a plurality of ADCs 31 and 32 are compensated for. Instead, the offset signal Doffset is added only to a smaller one of the first digital video signal Douta and the second digital video signal Doutb. Therefore, an offset between the first digital video signal Douta and the second digital video signal Doutb can be rapidly compensated for.

While example embodiments have been particularly shown and described, it will be understood by those of ordinary skill in the art that various changes in form and details may be made therein without departing from the spirit and scope of the present invention as defined by the following claims.

What is claimed is:

1. A video signal processing apparatus, comprising:
   a first analog-to-digital converter (ADC) configured to convert an analog video signal into a first digital video signal at rising edges of a first clock; and
   a second ADC configured to convert the analog video signal into a second digital video signal at rising edges of a second clock that is different from the first clock;
   wherein the first clock and the second clock are generated to have a first phase difference in a first section of the analog video signal, such that the first ADC and the second ADC operate alternately in an order of the first ADC and the second ADC, and the first clock and the second clock are generated to have a second phase difference, that is different from the first phase difference, in a second section of the analog video signal that is different from the first section of the analog video signal, such that the first ADC and the second ADC operate alternately in the order of the second ADC and the first ADC.

2. The apparatus of claim 1, further comprising:
   a clock generator configured to generate the first clock and the second clock, such that the first clock and the second clock have the first phase difference in the first section of the analog video signal, and such that the first clock and the second clock have the second phase difference, that is different from the first phase difference, in the second section of the analog video signal.

3. The apparatus of claim 2, wherein the clock generator is configured to receive a horizontal synchronization signal and is configured to determine the second section of the analog video signal based on the horizontal synchronization signal.

4. The apparatus of claim 2, wherein the clock generator is configured to receive a vertical synchronization signal and is configured to determine the second section of the analog video signal based on the vertical synchronization signal.

5. The apparatus of claim 1, further comprising:
   a clock generator configured to generate the first clock and the second clock in synchronization with a reference clock;
   wherein a frequency of the first clock and a frequency of the second clock are half a frequency of the reference clock.

6. The apparatus of claim 1, further comprising:
   a correction logic configured to synthesize the first digital video signal and the second digital video signal into a single digital video signal; and
   an adder configured to compensate for offset of the single digital video signal.

7. The apparatus of claim 6, wherein the correction logic is configured to generate the single digital video signal that comprises the first digital video signal as an odd field and the second digital video signal as an even field.

8. The apparatus of claim 7, wherein the adder is configured to receive a select signal which selects any one of the odd field and the even field and is configured to compensate for offset of a digital video signal of the selected field.

9. The apparatus of claim 1, further comprising:
   a clamp circuit configured to adjust direct current (DC) level of the analog video signal;
   wherein the clamp circuit comprises:
      a first current source connected to a first voltage;
      a second current source connected to a second voltage;
      a first switch connecting the first current source to a receiving terminal of the analog video signal; and
      a second switch connecting the second current source to the receiving terminal of the analog video signal.

10. The apparatus of claim 9, wherein the receiving terminal of the analog video signal comprises an alternating current (AC) coupling capacitor.

11. A video signal processing apparatus, comprising:
   a first analog-to-digital converter (ADC) configured to convert an analog video signal into a first digital video signal;
   a second ADC configured to convert the analog video signal into a second digital video signal; and
   a clock generator configured to generate a first clock that operates the first ADC and a second clock that operates the second ADC and is different from the first clock;
   wherein the clock generator is configured to change an order in which the first ADC and the second ADC operate alternately by changing a phase difference between the first clock and the second clock when a switch is made from one line or frame of the analog video signal to another.

12. The apparatus of claim 11, wherein the clock generator is configured to receive a horizontal synchronization signal and is configured to determine whether a switch is made from one line of the analog video signal to another based on the horizontal synchronization signal.

13. The apparatus of claim 11, wherein the clock generator is configured to receive a vertical synchronization signal and is configured to determine whether a switch is made from one frame of the analog video signal to another based on the vertical synchronization signal.

14. The apparatus of claim 11, further comprising:
a correction logic configured to generate a single digital video signal that comprises the first digital video signal as an odd field and the second digital video signal as an even field; and
an adder configured to receive a select signal that selects any one of the odd field and the even field and configured to compensate for offset of a digital video signal of the selected field.

15. The apparatus of claim 11, further comprising:
a clamp circuit configured to adjust direct current (DC) level of the analog video signal;
wherein the clamp circuit comprises:
a first current source connected to a first voltage;
a second current source connected to a second voltage;
a first switch connecting the first current source to a receiving terminal of the analog video signal; and
a second switch connecting the second current source to the receiving terminal of the analog video signal.

16. A video signal processing apparatus, comprising:
first and second analog-to-digital converters (ADC) configured to operate in a time-interleaving manner according to first and second clocks, respectively;
wherein the first and second ADCs are configured to convert an analog video signal into first and second digital video signals, respectively,
wherein the first clock and the second clock are generated to have a first phase difference in a first section of the analog video signal and a second phase difference in a second section of the analog video signal, and
wherein the first and second ADCs operate alternately in a first order in the first section of the analog video signal and in a second order in the second section of the analog video signal.

17. The apparatus of claim 16, further comprising:
a clock generator configured to generate the first and second clocks.

18. The apparatus of claim 16, further comprising:
a correction logic configured to synthesize the first and second digital video signals into a single digital video signal.

19. The apparatus of claim 18, further comprising:
an adder configured to compensate for offset of the single digital video signal.

20. The apparatus of claim 16, further comprising:
a clamp circuit configured to adjust direct current (DC) level of the analog video signal.

* * * * *